United States Patent
Sudo (10) Patent No.: US 8,129,790 B2
(45) Date of Patent: Mar. 6, 2012

(54) HOT PROCESS STI IN SRAM DEVICE AND METHOD OF MANUFACTURING

(75) Inventor: Gaku Sudo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/403,380

(22) Filed: Mar. 13, 2009

(65) Prior Publication Data

US 2009/0230504 A1 Sep. 17, 2009

Related U.S. Application Data

(60) Provisional application No. 61/036,991, filed on Mar. 17, 2008.

(51) Int. Cl.
*H01L 29/76* (2006.01)
*H01L 29/94* (2006.01)

(52) U.S. Cl. ......... 257/365; 257/347; 257/393; 438/152

(58) Field of Classification Search .................. 257/365, 257/368, 393, 347, 903, E29.02, E21.546; 438/152

See application file for complete search history.

(56) References Cited

U.S. PATENT DOCUMENTS

2006/0105536 A1* 5/2006 Cheng et al. .................. 438/386
2007/0138533 A1* 6/2007 Dennard et al. .............. 257/314

FOREIGN PATENT DOCUMENTS

JP 06-334030 12/1994
JP 2006-203198 8/2006

OTHER PUBLICATIONS

Yang, M, et al. ,"High Performance CMOS Fabricated on Hybrid Substrate with Different Crystal Orientations," Electron Devices Meeting, 2003. IEDM apos; 03 Technical Digest. IEEE International; Volume, Issue , Dec. 8-10, 2003 pp. 18.7.1-18.7.4.
Notice of Reasons for Rejection for corresponding Japanese Patent Application No. 2009-063685 mailed Jan. 10, 2012.

* cited by examiner

*Primary Examiner* — Theresa T Doan
(74) *Attorney, Agent, or Firm* — Banner & Witcoff, Ltd.

(57) ABSTRACT

A structure and method for forming SRAMs on HOT substrates with STI is described. Logic circuits may also be fabricated on the same chip with some devices on the SOI regions and other devices on the SOI regions.

3 Claims, 13 Drawing Sheets

HOT PROCESS STI IN SRAM DEVICE AND METHOD OF MANUFACTURING

RELATED APPLICATION

This application claims priority to U.S. Provisional Application Ser. No. 61/036,991, filed Mar. 17, 2008, whose contents are expressly incorporated herein by reference.

TECHNICAL FIELD

Aspects of the invention relate to semiconductors.

BACKGROUND

SRAM cells are popular for applications in which speed and/or low power consumption are important. For instance, large scale integrated circuits incorporating an L1 or L2 cache would benefit from using SRAMs. However, because of the number of transistors (and therefore real estate consumed), adding SRAMs into large LSIs has been difficult. Because of the large size of each SRAM cell and the number of cells required to be a functioning cache, the size of the LSI can be heavily dependent on the SRAM unit cell size.

The minimum width of device separation in SRAMs has conventionally been large, thereby hindering the adoption of SRAMs in LSIs.

SUMMARY

Aspects of the invention pertain to providing a SRAMs and logic circuits on the same integrated circuit using combinations of HOT processing and STI between individual devices.

DETAILED DESCRIPTION

One or more aspects of the invention relate to forming SRAM devices and logic devices using HOT processing and STI.

It is noted that various connections are set forth between elements in the following description. It is noted that these connections in general and, unless specified otherwise, may be direct or indirect and that this specification is not intended to be limiting in this respect.

Silicon-on-insulator (SOI) technology has provided a number of benefits to the advancement of semiconductor devices and device processing. One advantage is the use of hybrid orientation technology (HOT) that provides a structure by which different silicon crystal orientations may be used in a single chip. As an example, a silicon substrate may have a crystalline orientation of (100) and a second silicon region may have a crystalline orientation of (110). The second silicon region may be disposed on top of a buried oxide layer (BOX) surrounded by shallow trench isolation regions (STI). By placing a seed crystal in the second silicon region, the silicon in the second region may be grown in accordance with the orientation of the seed crystal. The result is different silicon crystalline orientations for use in the same chip.

The different orientations permit adjustments to particular circuit devices by the selection of the orientation of the substrate as compared to changing the device size. For instance, differences between nFETs and pFETs constructed on a silicon layer having a (100) orientation may be minimized by selectively moving one of these devices to a silicon layer having a (110) orientation, while keeping the same design rules for both devices.

In accordance with one or more aspects, a buried oxide layer is provided on or in a substrate. A different orientation of the bulk material may then be deposited or grown on the buried oxide layer. Circuits may then be formed in the semiconductor with the first orientation and in the semiconductor with the second orientation. Logic devices benefit from transistors being placed on different substrate orientations to minimize differences in their device characteristics. For instance, pFETs may be placed on epitaxial silicon of a first crystalline silicon orientation while nFETs may be placed on silicon on insulator (SOI) regions over a buried oxide layer (BOX).

SRAM cells have conventionally been placed on bulk silicon regions (or epitaxial regions). The layout and spacing of the SRAMs has been based on providing enough distance between the cells to prevent interference with surrounding cells. This has resulted in a large footprint for SRAM unit cells. The design rule used was to physically separate the unit cells until the cells were effectively electrically separated from each other.

Further, the physical spacing limit is due to the need for a common window to expose the nested lines/spaces (L/S), isolated spaces, and isolated lines at the same time. While forming nested lines/spaces can be formed at a high degree of resolution, forming isolated lines or isolated spaces at a high degree of resolution requires a different window size. Accordingly, the lowest common denominator between nested lines and spaces and isolated lines and spaces results in larger devices.

These conventional approaches result with SRAMs and their associated spacing requiring such a large physical space that resulting LSIs must be large or the number of SRAMs reduced.

Aspects of the present invention relate to providing SRAMs on SOI layers as insulated by STIs in combination with HOT processing of logic circuits. The minimum width of device separation on SOI is based on the physical separation of devices rather than on the electrical separation because of the insulator below the silicon layer. By the limited conduction path between devices, devices can be more closely packed. One or more aspects of the present invention is to provide SRAM cells that require smaller spaces by using a hybrid orientation technology (HOT) with shallow trench isolation (STI).

One or more aspects of the invention relates to making a SRAM Cell on SOI with a HOT process such that logic nFETs and pFETs are formed on a SOI region and a bulk region, respectively, while SRAM nFETs and pFETs are formed only on the SOI region.

FIGS. 1-6 describe a general HOT process. It is appreciated that other variations of HOT processing are known. Accordingly, the HOT processing approach of FIGS. 1-6 is provided as an example of HOT processing. This is not to be construed to be the only HOT processing technique available.

Figure 1:
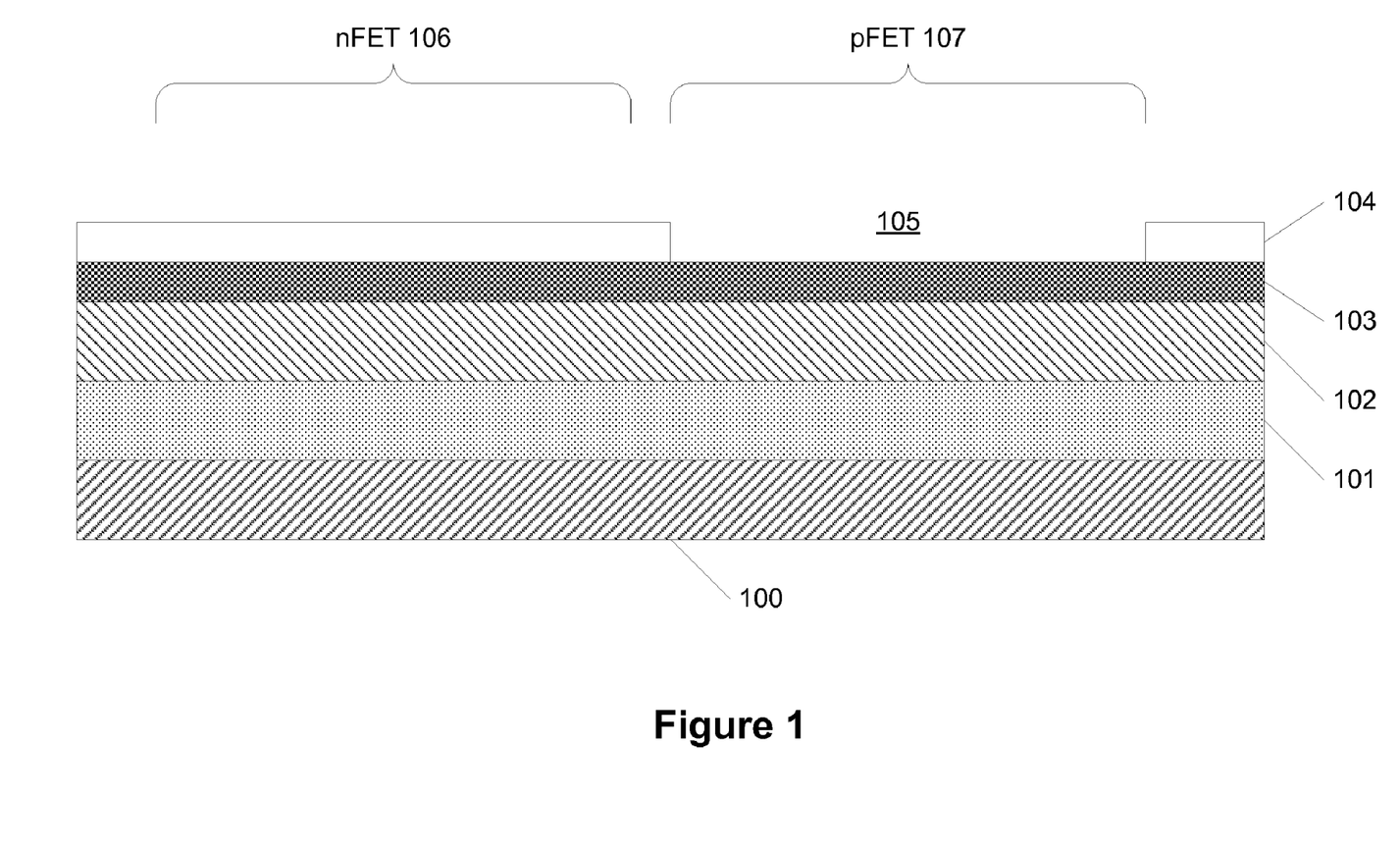
FIG. 1 shows a semiconductor substrate with a buried oxide layer after patterning having nFET and pFET regions.

FIG. 1 shows a semiconductor substrate with a buried oxide layer after patterning having nFET and pFET regions. FIG. 1 shows substrate 100 with buried oxide layer 101 on top of it. Silicon layer 102 is deposited on buried oxide layer 101. Here, in accordance with HOT processing, the crystalline orientation of bulk substrate 100 is different from that of the crystalline orientation of silicon layer (SOI) 102. Silicon nitride layer 103 is deposited on SOI 102. Resist 104 is deposited and patterned, resulting in FIG. 1. For purposes of explanation, FIG. 1 describes how HOT processing can be used for logic devices (namely, nFETs and pFETs) to enhance their operating parameters. nFET region 106 and pFET region 107 are shown in FIG. 1.

Figure 2:
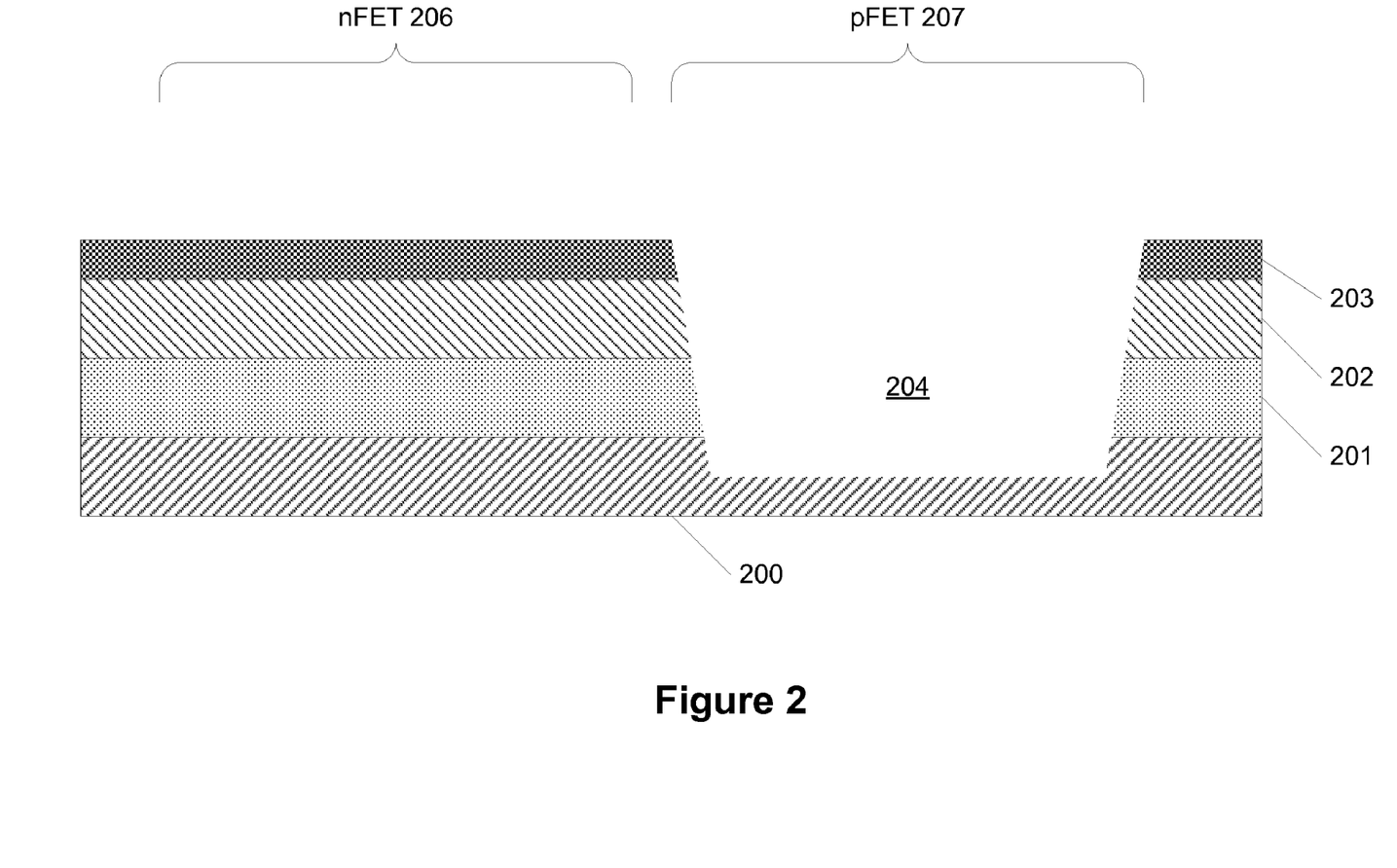
FIG. 2 shows the semiconductor substrate of FIG. 1 after etching.

FIG. 2 shows the semiconductor substrate of FIG. 1 after etching. FIG. 2 shows substrate 200, BOX 201, SOI 202, and SiN 203. FIG. 2 also shows nFET region 206 and pFET region 207. For instance, the etching technique may include reactive ion etching as is known in the art. Here, the etching process was permitted to reach into substrate 200, resulting in opening 204.

Figure 3:
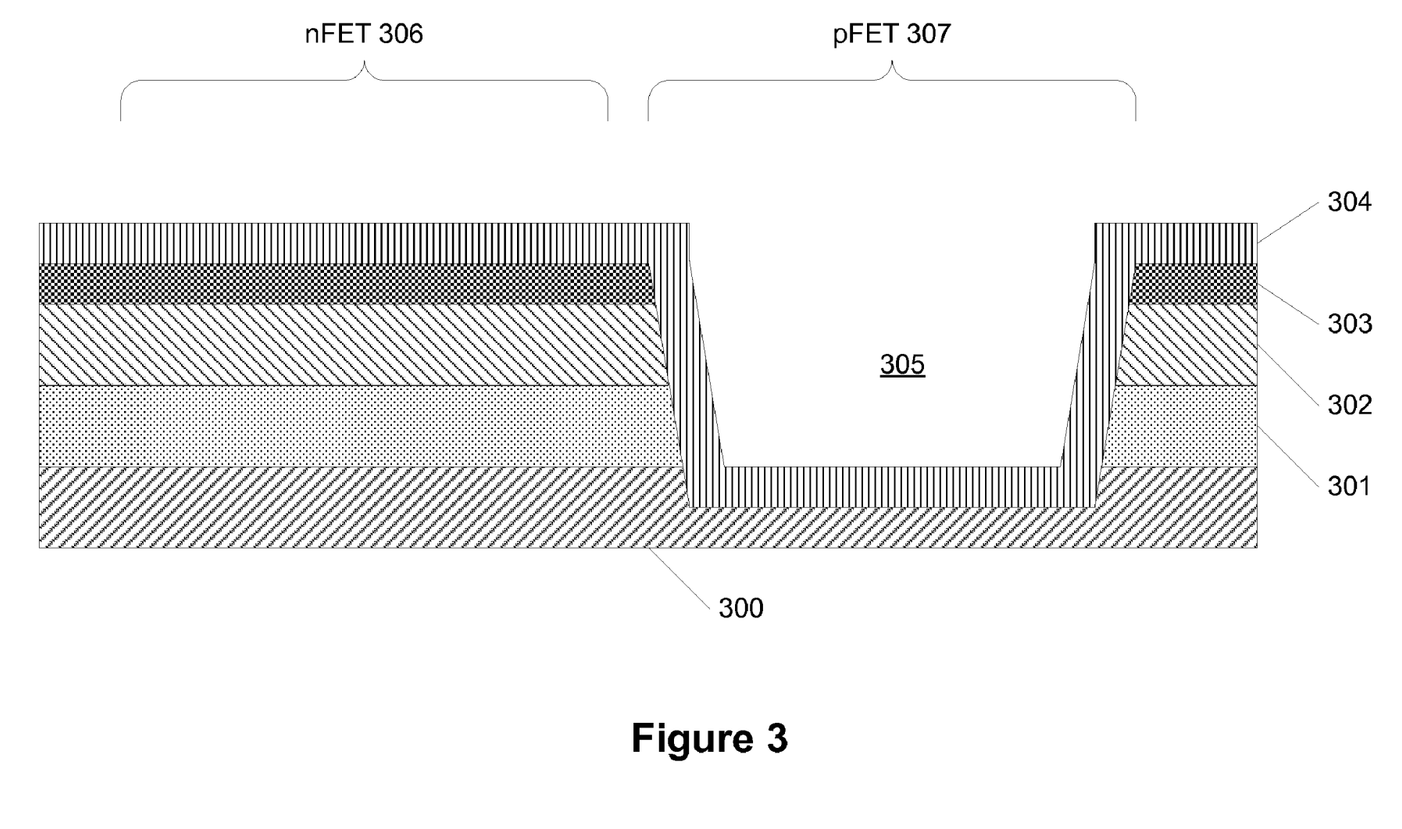
FIG. 3 shows the semiconductor substrate of FIG. 2 after an oxide deposition.

FIG. 3 shows the semiconductor substrate of FIG. 2 after an oxide deposition. FIG. 3 shows substrate 300, BOX 301, SOI 302, and SiN 303. FIG. 3 also shows nFET region 306 and pFET region 307. Oxide 304 is deposited over the entire surface. Here, oxide 304 is beneficial as it insulates SOI 302 from bulk silicon regions (as shown in FIGS. 5 and 6 below).

Figure 4:
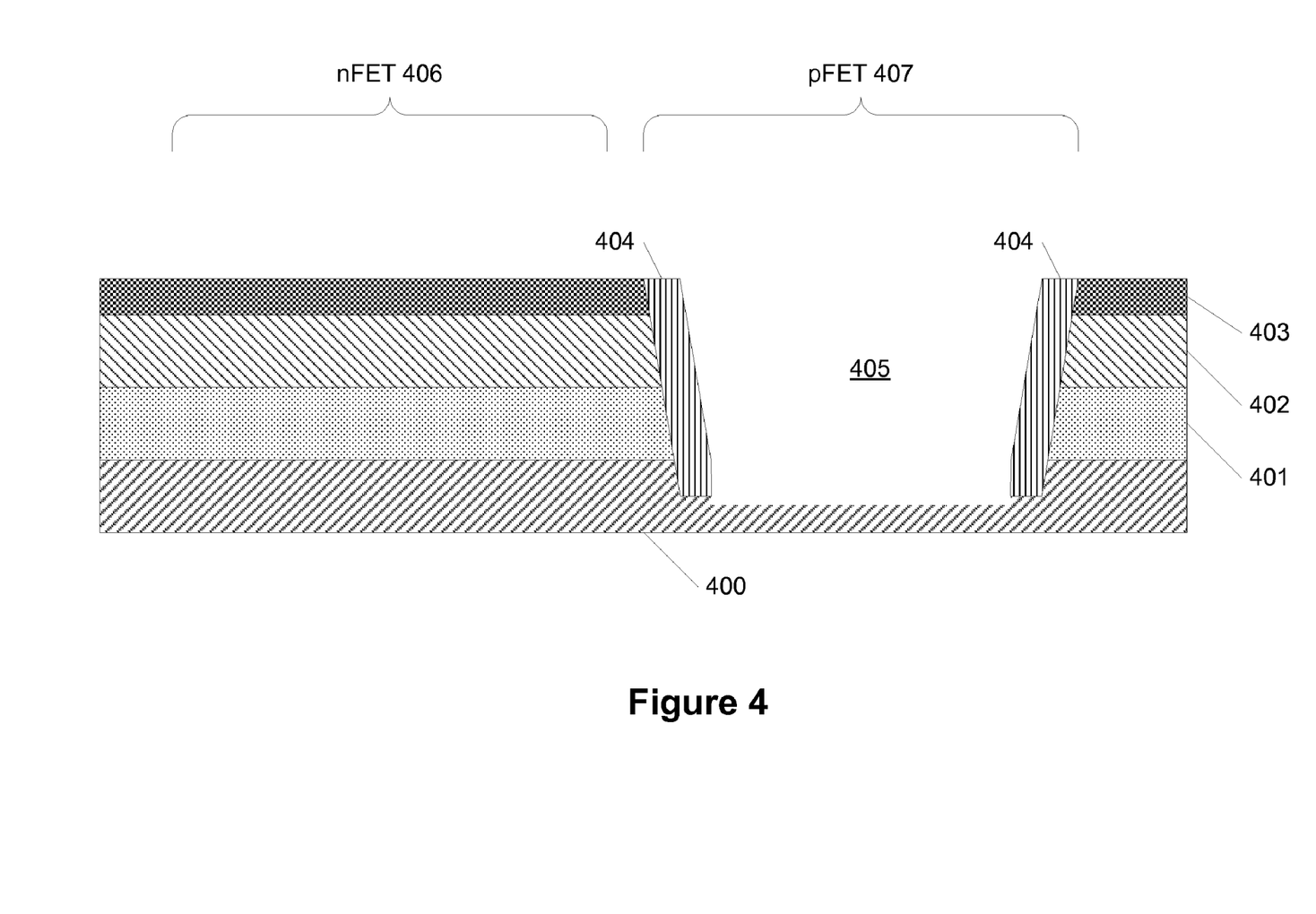
FIG. 4 shows the semiconductor substrate of FIG. 3 after etching.

FIG. 4 shows the semiconductor substrate of FIG. 3 after etching. Here, another reactive ion etch may be used. FIG. 4 shows substrate 400, BOX 401, SOI 402, and SiN 403. FIG. 4 also shows nFET region 406 and pFET region 407. Sidewall oxides 404 remain on the sides of opening 405 after the etch step. The etch step is permitted to contact or etch a small distance into substrate 400 to permit the removal of any remaining oxide 304 from the bottom of the opening 405.

Figure 5:
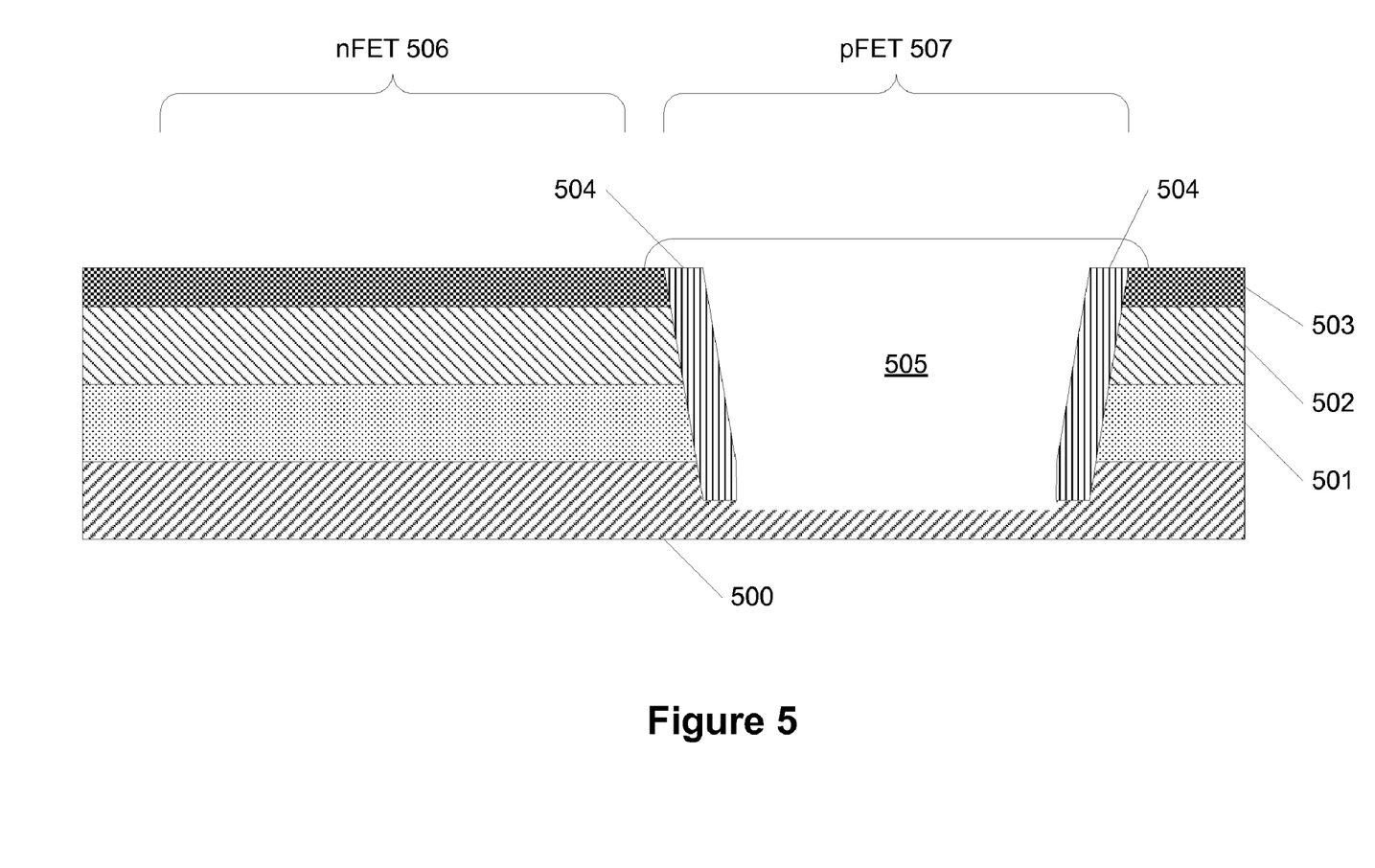
FIG. 5 shows the semiconductor substrate of FIG. 4 after growth of epitaxial silicon.

FIG. 5 shows the semiconductor substrate of FIG. 4 after growth of epitaxial silicon. FIG. 5 shows substrate 500, BOX 501, SOI 502, and SiN 503. FIG. 5 also shows nFET region 506 and pFET region 507. The epitaxial silicon 505 is grown based on the seed orientation of substrate 500. Sidewall oxides 504 help insulate epitaxial silicon 505 from SOI 502.

Figure 6:
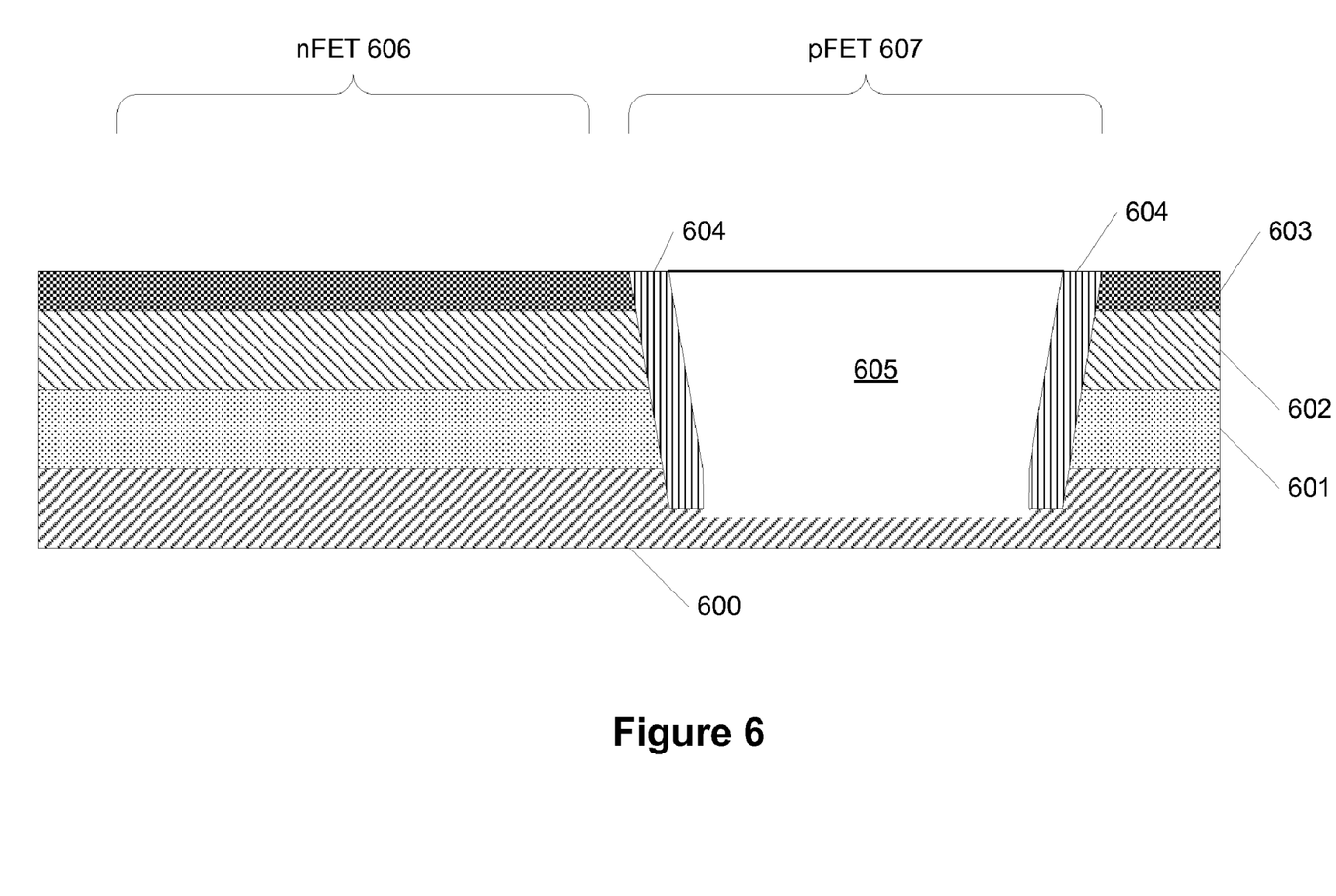
FIG. 6 shows the semiconductor substrate of FIG. 5 after polishing.

FIG. 6 shows the semiconductor substrate of FIG. 5 after polishing. FIG. 6 shows substrate 600, BOX 601, SOI 602, SiN 603, sidewalls 604, and epitaxial silicon 605. FIG. 6 also shows nFET region 606 and pFET region 607. For instance, chemical mechanical polishing may be used to polish away any of the epitaxial filler 605 remaining above silicon nitride 603. Further, silicon nitride layer 603 may further be polished away (or removed through other known techniques) to expose the SOI 602 and expose epitaxial silicon 605.

FIGS. 1-6 provide a HOT process for use with logic gates. FIGS. 7-12 provide a similar process but include processing for an SRAM region.

Figure 7:
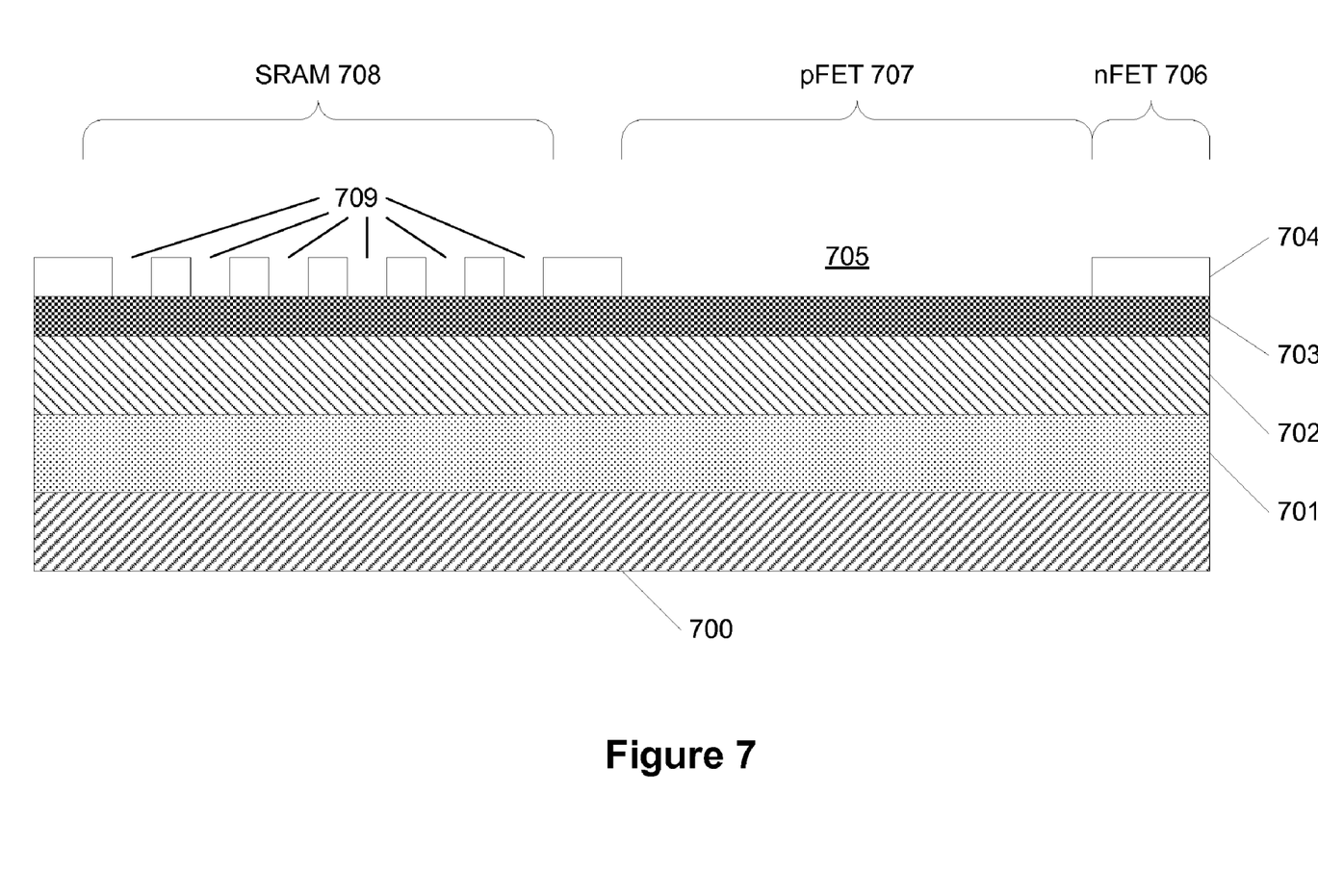
FIG. 7 shows another semiconductor substrate with a buried oxide layer after patterning with SRAM, pFET, and nFET regions.

FIG. 7 shows another semiconductor substrate with a buried oxide layer after patterning with SRAM, pFET, and nFET regions. FIG. 7 shows substrate 700, BOX 701, SOI 702, SiN 703, patterned resist layer 704 (with openings 705 and 709). FIG. 7 shows nFET region 706, pFET region 707, and SRAM region 708.

Figure 8:
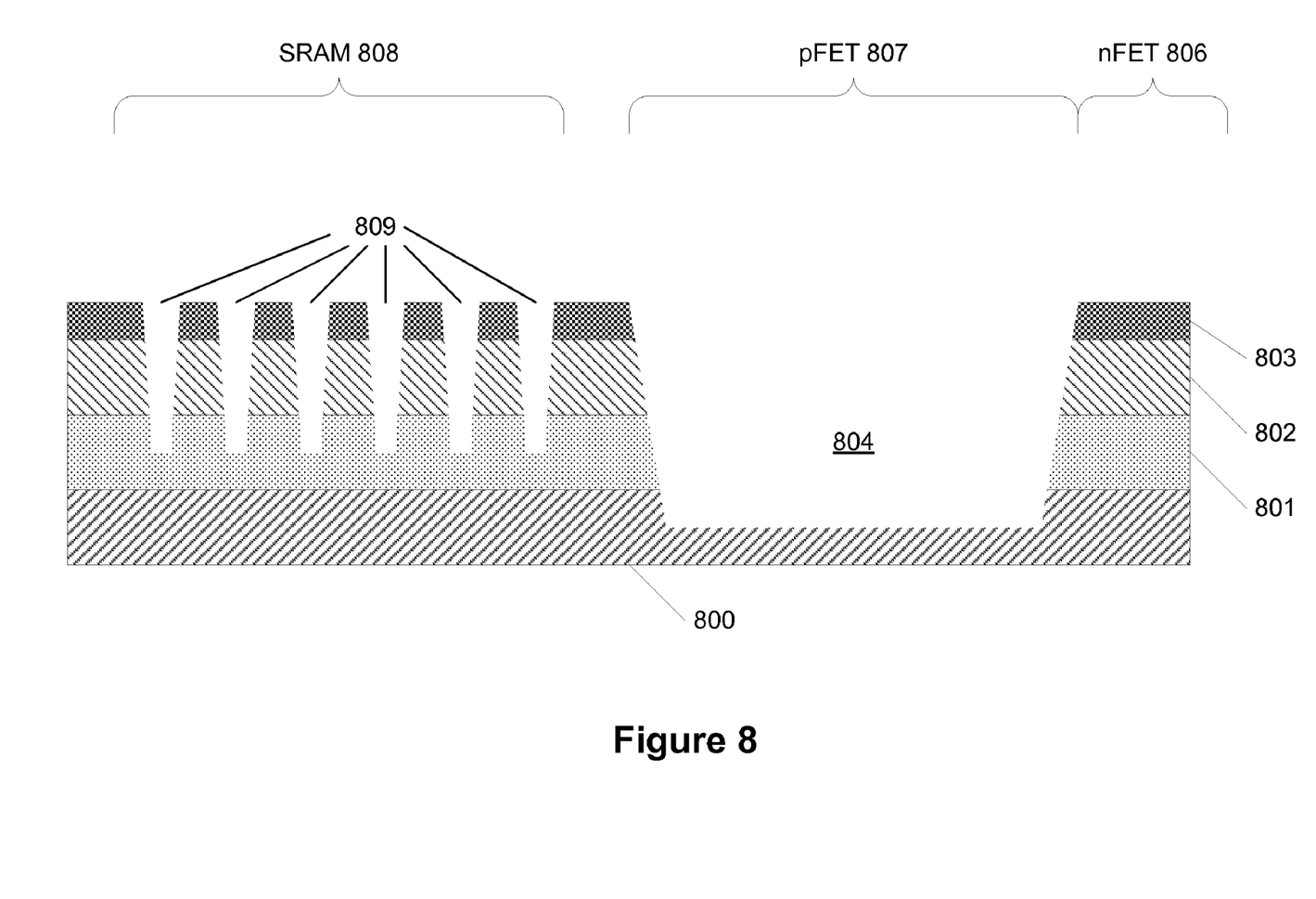
FIG. 8 shows the semiconductor substrate of FIG. 7 after etching.

FIG. 8 shows the semiconductor substrate of FIG. 7 after etching and resist removal. For instance, an RIE etch may be used. FIG. 8 shows substrate 800, BOX 801, SOI 802, SiN 803, opening 804 (for subsequent epitaxial silicon growth) and trenches 809. FIG. 8 shows nFET region 806, pFET region 807, and SRAM region 808.

Figure 9:
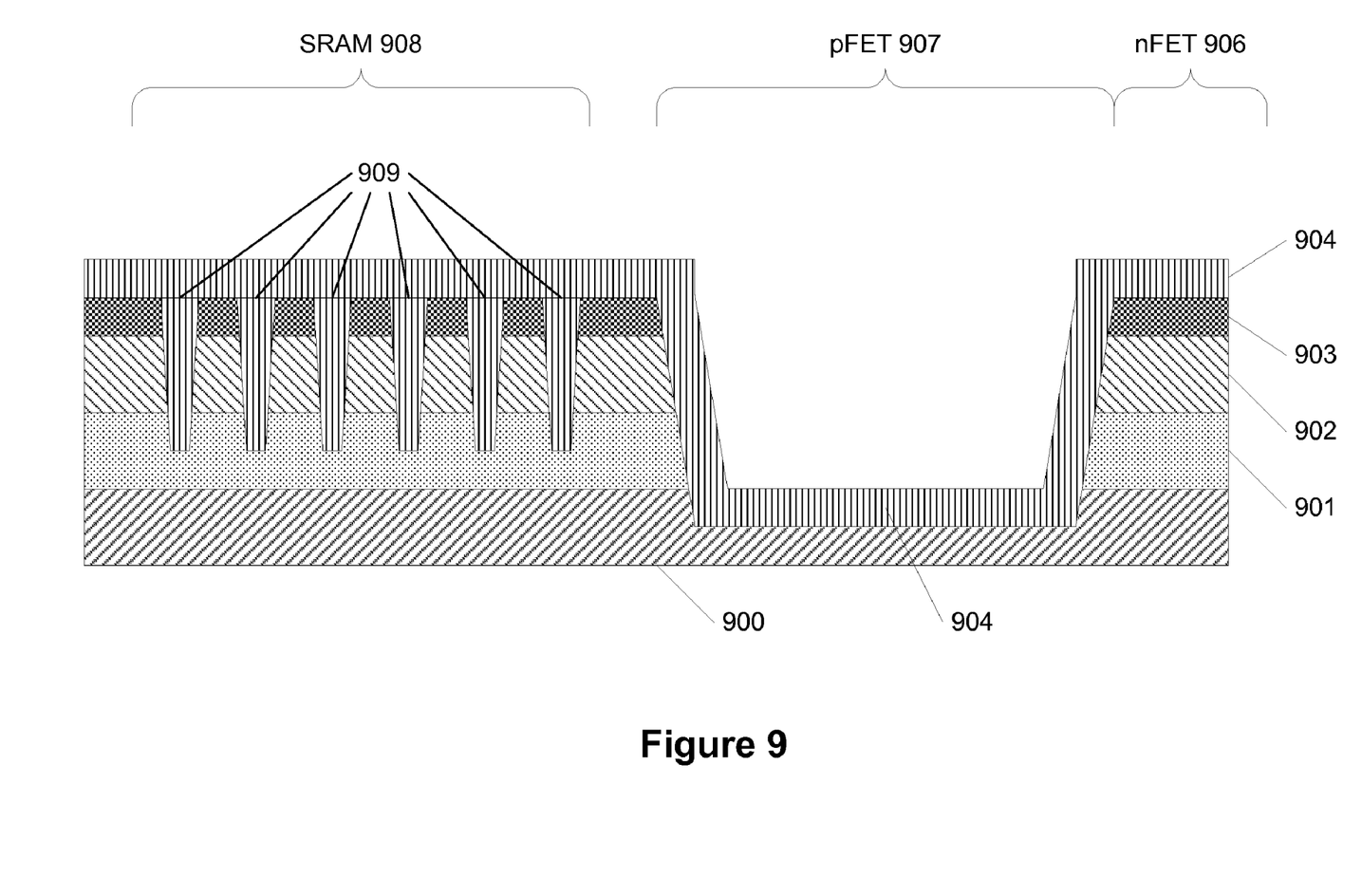
FIG. 9 shows the semiconductor substrate of FIG. 8 after an oxide deposition.

FIG. 9 shows the semiconductor substrate of FIG. 8 after an oxide deposition. FIG. 9 shows substrate 900, BOX 901, SOI 902, and SiN 903. FIG. 9 also shows nFET region 906, pFET region 907, and SRAM region 808. Oxide 904 is deposited over the entire surface. Here, oxide 904 is beneficial as it insulates SOI 902 from bulk silicon (and/or epi silicon) regions (as shown in FIGS. 11 and 12 below). Here, oxide 904 is deposited into the trenches 809, resulting in shallow trench isolations (STIs) 909.

Figure 10:
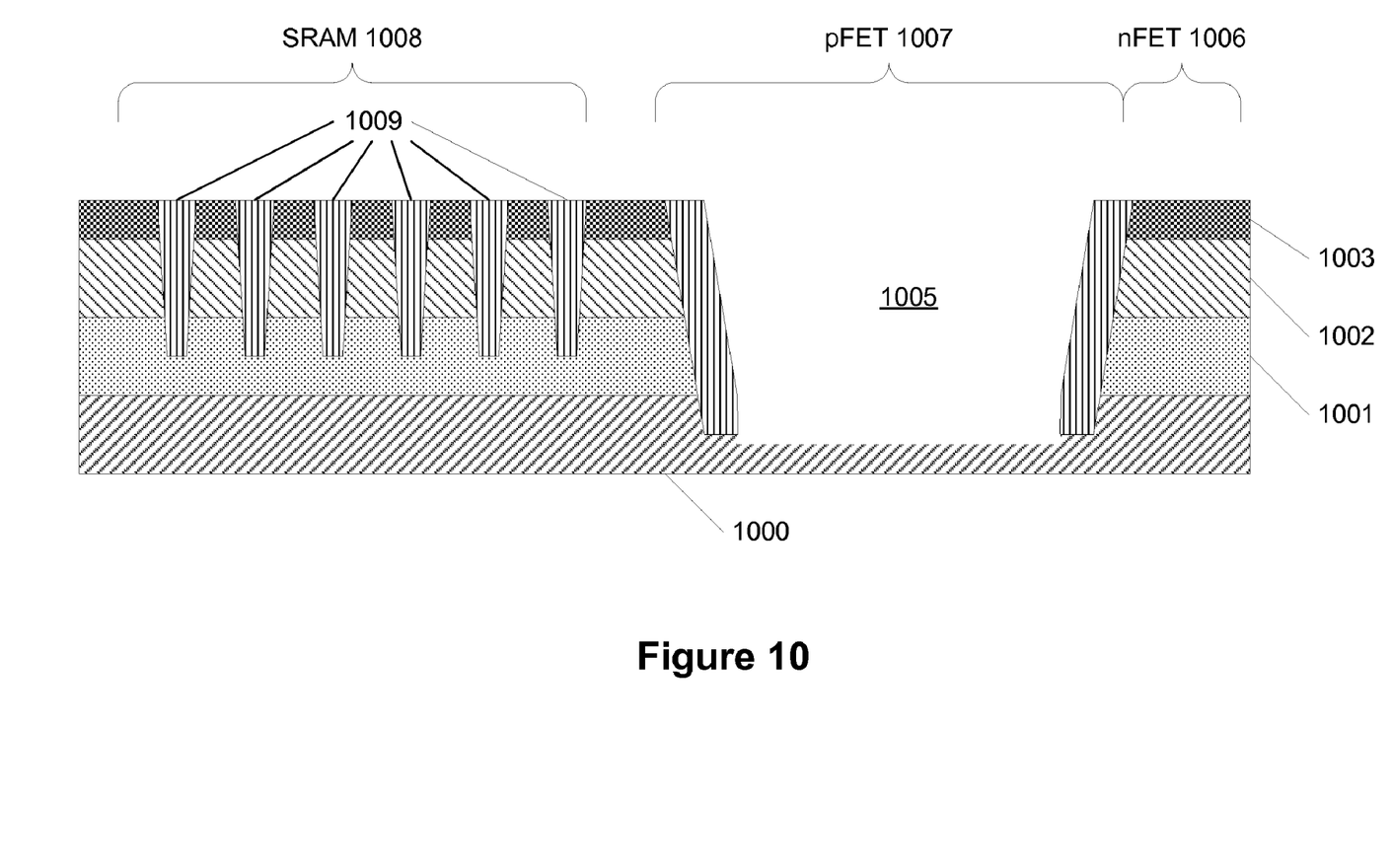
FIG. 10 shows the semiconductor substrate of FIG. 9 after etching.

FIG. 10 shows the semiconductor substrate of FIG. 9 after etching. Here, another reactive ion etch may be used. FIG. 10 shows substrate 1000, BOX 1001, SOI 1002, and SiN 1003. FIG. 10 shows nFET region 1006, pFET region 1007, and SRAM region 1008. Sidewall oxides 1004 remain on the sides of opening 1005 after the etch step. The etch step is permitted to contact or etch a small distance into substrate 1000 to permit the removal of any remaining oxide 904 from the bottom of the opening 1005.

Figure 11:
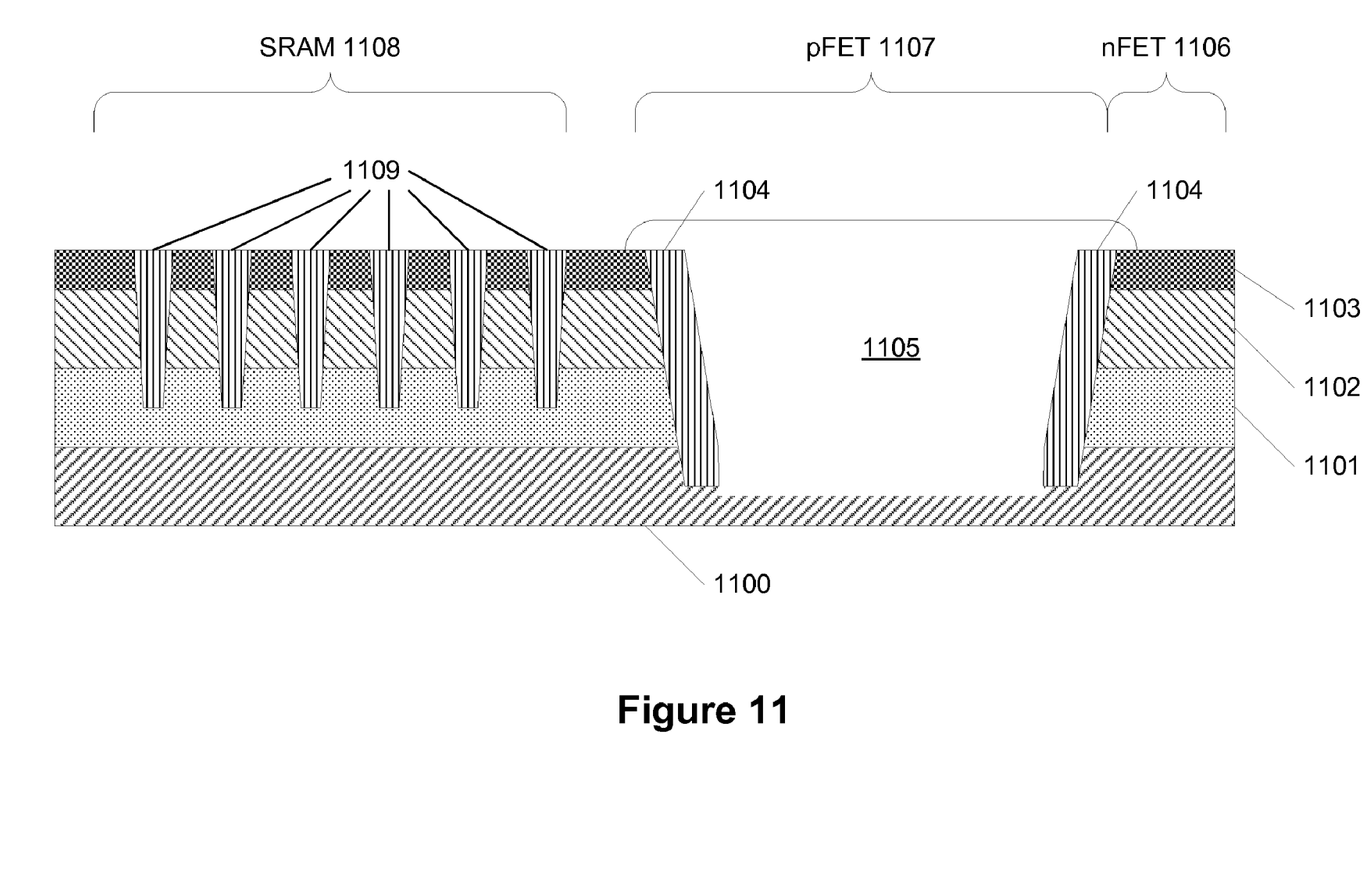
FIG. 11 shows the semiconductor substrate of FIG. 10 after growth of epitaxial silicon.

FIG. 11 shows the semiconductor substrate of FIG. 10 after growth of epitaxial silicon. FIG. 11 shows substrate 1100, BOX 1101, SOI 1102, and SiN 1103. FIG. 11 shows nFET region 1106, pFET region 1107, and SRAM region 1108. The epitaxial silicon 1105 is grown based on the seed orientation of substrate 1100. Sidewall oxides 1104 help insulate epitaxial silicon 1105 from SOI 1102.

Figure 12:
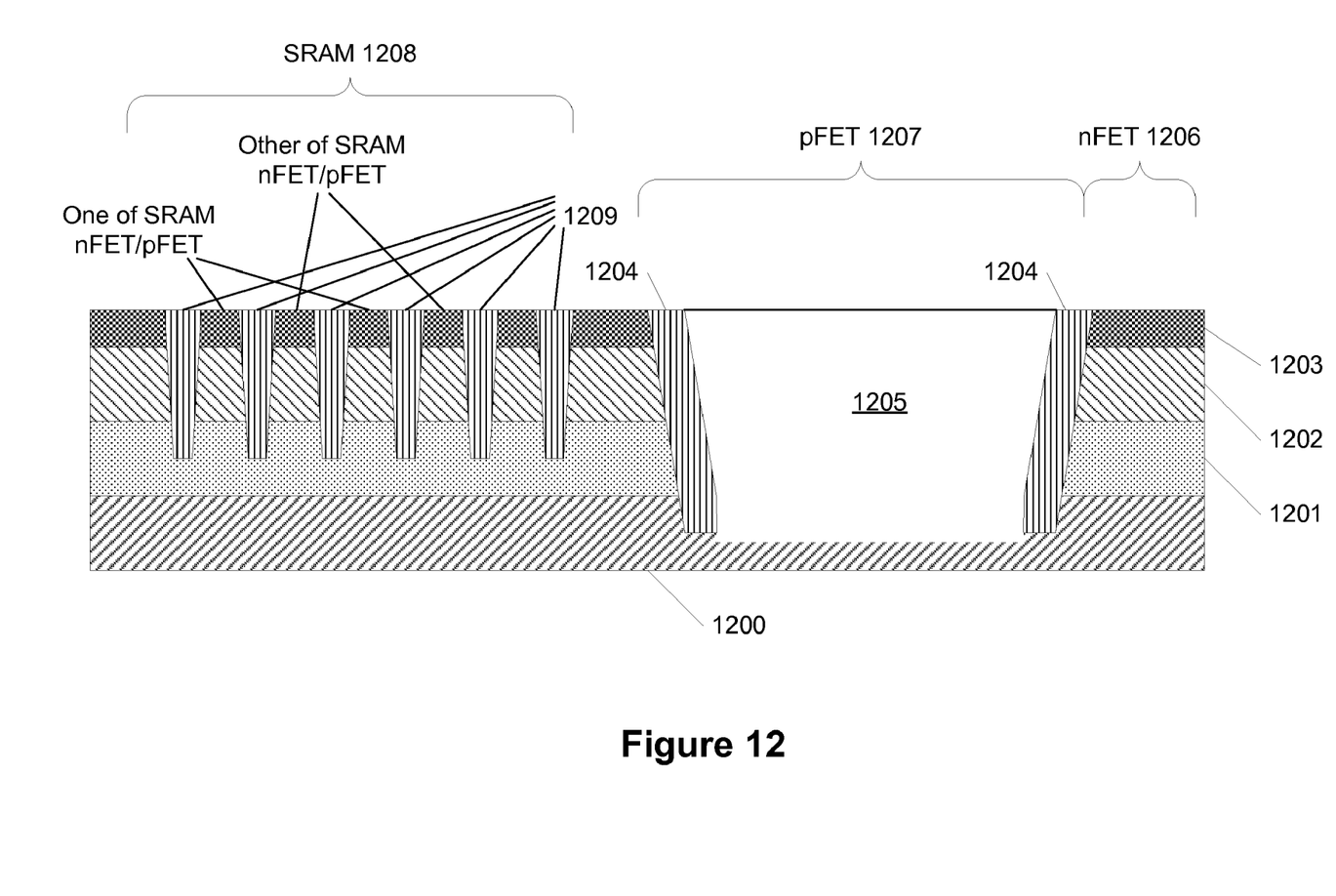
FIG. 12 shows the semiconductor substrate of FIG. 11 after polishing.

FIG. 12 shows the semiconductor substrate of FIG. 11 after polishing. FIG. 12 shows substrate 1200, BOX 1201, SOI 1202, and SiN 1203. FIG. 12 shows nFET region 1206, pFET region 1207, and SRAM region 1208. For instance, chemical mechanical polishing may be used to polish away any of the epitaxial filler 1205 remaining above silicon nitride 1203. Further, silicon nitride layer 1203 may further be polished away (or removed through other known techniques) to expose the SOI 1202 and expose epitaxial silicon 1205.

In one embodiment of the invention, SRAM cells are provided on the SOI region and can be isolated using STIs in the same process as HOT logic circuits. In the conventional approach, SRAM cells were provided on the bulk substrates where the logic formation process was separate (requiring separate processing steps throughout formation). Here, standard STIs are used in this embodiment.

Figure 13:
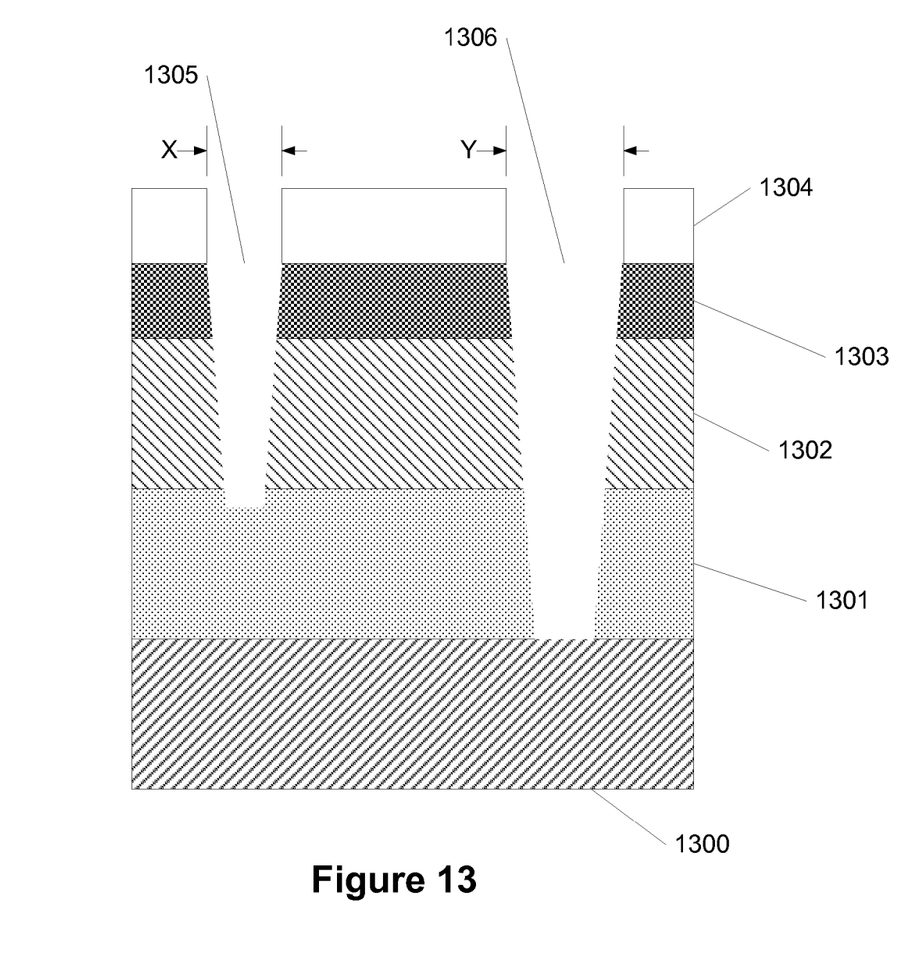
FIG. 13 shows an example of patterning widths required for etching to different levels.

In another embodiment, modified STIs are used in the SRAM region. FIG. 13 shows this embodiment. Specifically, FIG. 13 shows an example of patterning widths required for etching to different levels. In this embodiment of the invention, the depth of the STI regions for SRAM cells may be decreased because of the isolating properties of the combination of the STIs and the BOX layer. FIG. 13 shows a comparative example of an STI trench in accordance with one embodiment of the invention compared with a conventional STI trench.

FIG. 13 shows substrate 1300, BOX 1301, SOI 1302, SiN 1303, and patterned resist 1304. On the right of FIG. 13, trench 1306 is formed to extend to the surface of substrate 1300. The opening distance in the patterned resist 1304 to permit the reliable formation of trench 1306 is shown by width Y.

In contrast, at least one embodiment of the invention relies on shallower STI trenches 1305. Trenches 1305 extend to the top of or extending into BOX 1301. Because the STI trenches 1305 are shallower, the top opening dimension 1305 can be made smaller while keeping the sides of the trenches 1305 and 1306 at the same slope. Here, X is generally proportionally smaller than Y.

By using shallower STIs, the distance consumed by STIs in SOI layer 1302 can be reduced. Over the size of an LSI that has significant numbers of SRAM cells, the size of the unit area required by the SRAM cell (namely, the SRAM cell size plus the STI size) can be reduced, thereby reducing the total area required for SRAM cells.

It is appreciated that the BOX layer may be formed by etching into substrate as compared to layering the BOX layer on top of the substrate. In this alternative example, the epitaxial silicon may not be deposited, but rather the STI regions in the bulk region are formed directly in the substrate. This may allow for easier processing by not having to separately deposit the epitaxial silicon.

What is claimed is:

1. A semiconductor device comprising:
a logic region; and
an SRAM region in which SRAM nFETs and SRAM pFETs are formed,
the logic region including a pFET region and an nFET region
  the pFET region including
    a substrate;
    an epitaxial layer on the substrate, wherein pFETs are formed in the epitaxial layer;
  the nFET region including
    a substrate;
    a buried oxide layer on the substrate;
    a silicon layer on the buried oxide layer, wherein nFETs are formed in the silicon layer;
the SRAM region including
  a substrate;
  a buried oxide layer on the substrate;
  a silicon layer on the buried oxide layer, wherein the SRAM pFETs and the SRAM nFETs are formed in the silicon layer, such that the SRAM pFETs and the SRAM nFETs are positioned above the buried oxide layer of the SRAM region,
wherein the SRAM pFETs and the SRAM nFETs are separated by shallow trench isolation,
wherein the shallow trench isolation extends at least to a top of the buried oxide layer and not extend to the substrate, and
wherein a top dimension of the shallow trench isolation is smaller than that of the epitaxial layer.

2. The semiconductor device according to claim 1,
wherein the shallow trench isolation extends to the substrate.

3. A semiconductor device comprising:
a logic region;
an SRAM region in which SRAM nFETs and SRAM pFETs are formed, and
an intermediary region between the logic region and the SRAM region,
the logic region including a pFET region and an nFET region,
  the pFET region including
    a substrate;
    an epitaxial layer on the substrate, wherein pFETs are formed in the epitaxial layer;
  the nFET region including
    a substrate,
    a buried oxide layer on the substrate,
    a silicon layer on the buried oxide layer, wherein nFETs are formed in the silicon layer, and
the SRAM region including
  a substrate,
  a buried oxide layer on the substrate, and
  a silicon layer on the buried oxide layer, wherein the SRAM pFETs and the SRAM nFETs are formed in the silicon layer, and
the intermediary region including:
  a substrate;
  a buried oxide layer on the substrate; and
  a silicon layer on the substrate
wherein the SRAM pFETs and the SRAM nFETs are separated by shallow trench isolation,
wherein the shallow trench isolation extends at least to a top of the buried oxide layer and not extend to the substrate, and
wherein a top dimension of the shallow trench isolation is smaller than that of the epitaxial layer.

* * * * *